(12) United States Patent
Treiber et al.

(10) Patent No.: US 6,538,894 B1
(45) Date of Patent: Mar. 25, 2003

(54) FRONT INSERTION FASTENER SYSTEM

(75) Inventors: Mark R. Treiber, Philadelphia, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 128 days.

(21) Appl. No.: 09/779,121

(22) Filed: Feb. 8, 2001

(51) Int. Cl.[7] .............................. H05F 5/00; F16B 13/04
(52) U.S. Cl. ................. 361/724; 312/223.2; 312/265.4; 411/38; 411/333
(58) Field of Search ............................... 411/34–38, 49; 312/223.1, 223.2; 361/724

(56) References Cited

U.S. PATENT DOCUMENTS

| | | | | |
|---|---|---|---|---|
| 4,222,304 A | * | 9/1980 | Yoshida et al. | 411/34 |
| 4,642,009 A | * | 2/1987 | Fischer | 411/38 |
| 4,730,967 A | * | 3/1988 | Warkentin | 411/103 |
| 5,078,561 A | * | 1/1992 | Wollar et al. | 411/38 |
| 5,294,223 A | * | 3/1994 | Phillips, II | 411/113 |
| 6,161,998 A | * | 12/2000 | Brown | 411/113 |
| 6,360,900 B1 | * | 3/2002 | Carbonneau et al. | 211/26 |

* cited by examiner

*Primary Examiner*—Gerald Tolin
*Assistant Examiner*—Anthony Q. Edwards
(74) *Attorney, Agent, or Firm*—Law Office of Gary M. Cohen; Lise A. Rode; Mark T. Starr

(57) ABSTRACT

An apparatus is provided for retaining a threaded fastener in an aperture of a support. The apparatus includes a flange position to limit the insertion of the apparatus within the aperture of the support. The apparatus also includes a body extending axially from the flange and being sized for insertion within the aperture of the support. The body defines an opening extending through proximal and distal sections of the body. The opening in the body is sized to receive a threaded fastener in the proximal section of the body, and the opening in the body is sized for engagement of the threaded fastener in the distal section of the body. The proximal section of the body is configured for radial deformation upon engagement of the threaded fastener in the distal section of the body. Such deformation prevents removal of the body of the apparatus from the aperture of the support. A fastener system and a rack mount computer cabinet including the apparatus are also provided.

30 Claims, 5 Drawing Sheets

FRONT INSERTION FASTENER SYSTEM

FIELD OF THE INVENTION

This invention relates to a front insertion fastener system. More specifically, this invention relates to a fastener system including an apparatus for retaining a threaded fastener in an aperture of a support.

BACKGROUND OF THE INVENTION

This invention addresses issues relating to the mounting of components in a cabinet. For example, it is often desirable to mount a computer component in a cabinet such as in a rack mount system. In such a system, a pattern of mounting holes is often provided in a support member of the cabinet, and nut clip fasteners are used to engage screws that mount the computer component to the cabinet's support member. The mounting holes are simply through-holes formed in the support member, and the nut clip fasteners provide the female threads necessary to engage the male threads of the screws. The nut clip fasteners are generally installed by sliding them into position from the side of the support member. They therefore "clip" the edge of the support member and position captured nuts behind the respective mounting holes.

A problem arises, however, when a computer component is being mounted within the cabinet and it is then discovered that one or more of the required nut clip fasteners have been forgotten. The clearance between the partially installed computer component and the support member of the cabinet is often too small to permit the installation of an omitted nut clip fastener. Because conventional nut clip fasteners are installed from the side of the support member, and because the support member of the cabinet is often closely adjacent the edge of the computer component, the clearance space between the support member and the computer component is often so small that it prevents sideward installation of the omitted nut clip fastener. Therefore, when the computer component is already inserted into the cabinet and the omission of one or more nut clip fasteners is discovered, it is necessary to remove all of the screws and retention hardware as well as the computer component from the cabinet so that the omitted nut clip fastener can be installed.

Accordingly, there is a need for a fastener system that can be inserted from the front of the cabinet's support member so that an omitted fastener can be installed. Such a fastener system would be especially beneficial when there is insufficient clearance to the side of the support member for the installation of a conventional nut clip fastener.

SUMMARY OF THE INVENTION

According to one aspect of this invention, an apparatus is provided for retaining a threaded fastener in an aperture of a support. The apparatus includes a flange positioned to limit the insertion of the apparatus within the aperture of the support. The apparatus also includes a body extending from the flange and being sized for insertion within the aperture of the support. The body defines an opening extending through proximal and distal sections of the body. The opening in the body is sized to receive a threaded fastener in the proximal section of the body, and the opening in the body is sized for engagement of the threaded fastener in the distal section of the body. The proximal section of the body is configured for deformation upon engagement of the threaded fastener in the distal section of the body. Such deformation prevents removal of the body of the apparatus from the aperture of the support.

According to another aspect of this invention, a fastener system is provided for mounting a component to a support. The fastener system includes a threaded fastener sized for insertion within apertures of the component and the support. The fastener system also includes an apparatus according to this invention.

According to yet another aspect of this invention, a computer cabinet is provided for mounting a computer component. The computer cabinet includes a support defining at least one aperture and a computer component position adjacent the support and having an aperture aligned with the aperture of the support. The computer cabinet also includes a threaded fastener inserted within the apertures of the computer component and the support. The computer cabinet also includes an apparatus according to this invention.

DETAILED DESCRIPTION OF THE PREFERRED EMBODIMENTS

Figure 1:
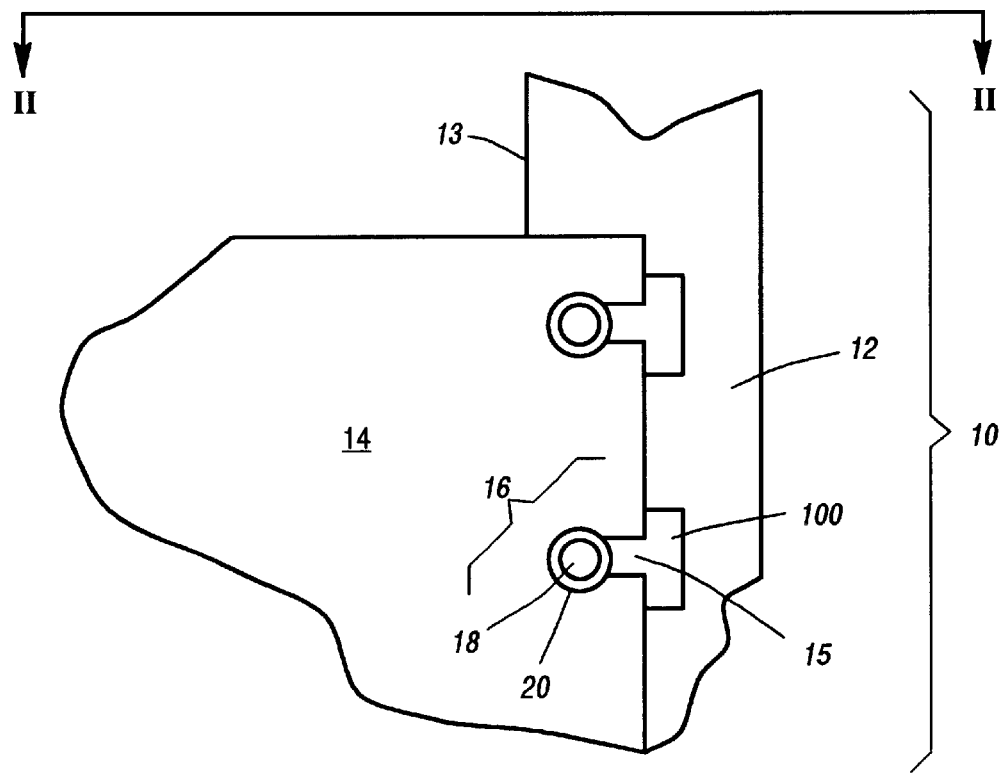
FIG. 1 is a partial front view of an embodiment of a computer cabinet according to this invention.

This invention will now be described with reference to several embodiments selected for illustration in the drawings. It will be appreciated that the scope and spirit of the invention are not limited to the illustrated embodiments. It will further be appreciated that the drawings are not rendered to any particular proportion or scale. Also, any dimensions referred to in the description of the illustrated embodiments are provided merely for the purpose for illustration. The invention is not limited to any particular dimensions, materials, or other details of the illustrated embodiments.

Referring generally to FIGS. 1–7, an apparatus 100 is provided for retaining a threaded fastener 18 in an aperture 11 of a support 12. The apparatus 100 includes a flange 102 positioned to limit insertion of the apparatus 100 within the aperture 11 of the support 12. The apparatus 100 also includes a body 104 extending from the flange 102 and being sized for insertion within the aperture 11 of the support 12. The body 104 of the apparatus 100 defines an opening 106 extending through a proximal section 108 and a distal section 110 of the body 104. The opening 106 in the body 104 is sized to receive the threaded fastener 18 in the proximal section 108 of the body 104. The opening 106 in the body 104 is also sized for engagement of the threaded fastener 18 in the distal section 110 of the body 104. The proximal section 108 of the body 104 is configured for deformation upon engagement of the threaded fastener 18 in the distal section 110 of the body 104. The resulting deformation prevents removal of the body 104 of the apparatus 100 from the aperture 11 of the support 12.

A fastener system 16 is also provided for mounting a component 14 to the support 12. The fastener system 16 includes a threaded fastener 18 sized for insertion within apertures 15 and 11 of the component 14 and the support 12, respectively. The fastener system 16 also includes the apparatus 100.

This invention also provides a computer cabinet 10 including the support 12 defining at least one aperture 11. The computer component 14 is positioned adjacent the support 12 and has an aperture 15 aligned with the aperture 11 of the support 12. The computer cabinet 10 also includes a threaded fastener 18 inserted within the apertures 15 and 11 of the computer component 14 and the support 12, respectively. Finally, the computer cabinet 10 includes the apparatus 100.

Figure 2:
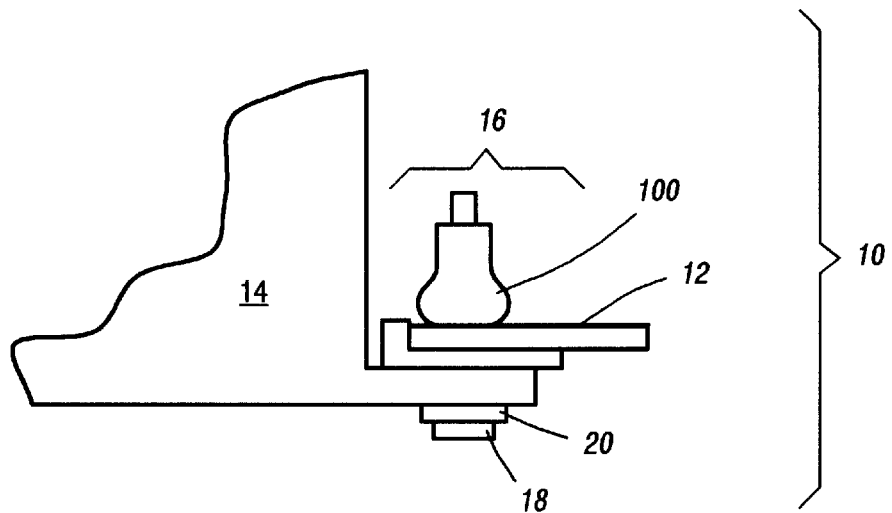
FIG. 2 is a partial top view of the computer cabinet shown in FIG. 1.
Figure 3:
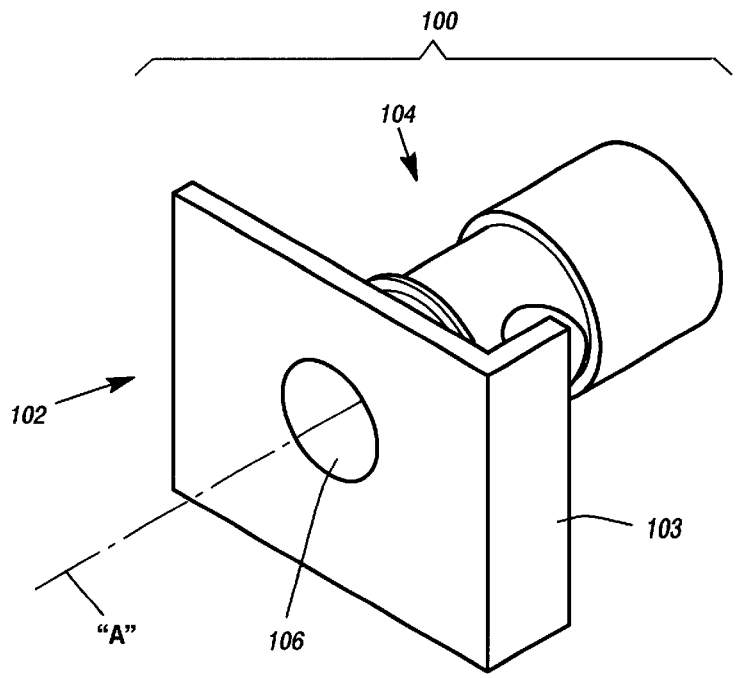
FIG. 3 is a front perspective view of an embodiment of an apparatus according to this invention.
Figure 4:
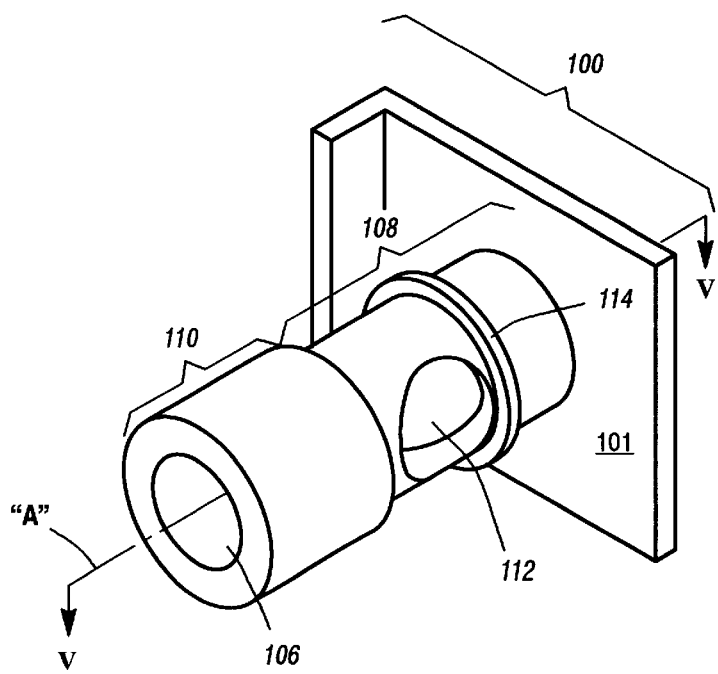
FIG. 4 is a rear perspective view of the apparatus shown in FIG. 3.

Exemplary details of selected embodiments of the invention will now be described. Referring to FIGS. 1 and 2, which illustrates a preferred embodiment of a computer cabinet 10, the computer cabinet 10 preferably includes a vertically extending, metallic frame or support 12 having an edge surface 13 facing toward a computer component 14 mounted within the computer cabinet 10. The computer component 14 has a mounting flange with one or more apertures 15 (two (2) shown in FIG. 1) to facilitate engagement between the computer component 14 and the support 12.

The fastener system 16 is used to mount the computer component 14 to the support 12. The fastener system 16 is adapted for front insertion. More specifically, in instances where there is insufficient clearance to insert a conventional nut clip fastener from the side of the support 12 to accept a threaded fastener 18 (i.e., along the edge surface 13 of the support 12), the fastener system 16 makes possible to bring about engagement between a threaded fastener 18 and the support 12 by means of an apparatus 100 that is inserted through the respective apertures from the front of the computer cabinet 10. If desired, the fastener system 16 can also include a metallic or polymeric washer 20.

As will be described later in further detail, the apparatus 100 is inserted within the aperture 11 of the support 12, the computer component 14 is positioned adjacent the apparatus 100, and the threaded fastener 18 (together with the washer 20) is engaged to the apparatus 100. As the threaded fastener 18 is tightened into threaded engagement with the apparatus 100, a portion of the apparatus 100 deforms radially outwardly to prevent the removal of the apparatus 100 from the aperture 11 of the support 12. Accordingly, the threaded fastener 18 is tightened into the apparatus 100, thereby mounting the computer component 14 to the support 12.

Referring specifically to FIGS. 3–6, exemplary details of the apparatus 100 will now be described. Apparatus 100 includes a flange 102 that extends radially outwardly with respect to an axis "A" of the body 104 of the apparatus 100. The flange 102 provides a surface 101 that bears against a facing surface of the support 12, thereby limiting the insertion of the apparatus 100 within the aperture 11 of the support 12. Preferably, the flange 102 extends radially outwardly from a proximal end portion of the body 104.

The flange 102 preferably includes a flange portion 103 that extends axially in a direction that is substantially parallel to the axis "A" of the body 104. The flange portion 103 of the flange 102 is positioned to contact the edge surface 13 of the support 12. It will be appreciated that the flange portion 103 of the flange 102 helps to resist the rotation of the apparatus 100 with respect to the support 12 as the threaded fastener 18 is inserted into an engaged with the apparatus 100.

The body 104 of the apparatus 100 is substantially tubular in shape in that it is preferably formed from a cylindrical wall defining an opening 106. The body 104 of the apparatus 100 includes a proximal section 108 and a distal section 110. The terms "proximal" and "distal" are used herein to designate positions toward the front and rear of the apparatus as installed, respectively.

Figure 5:
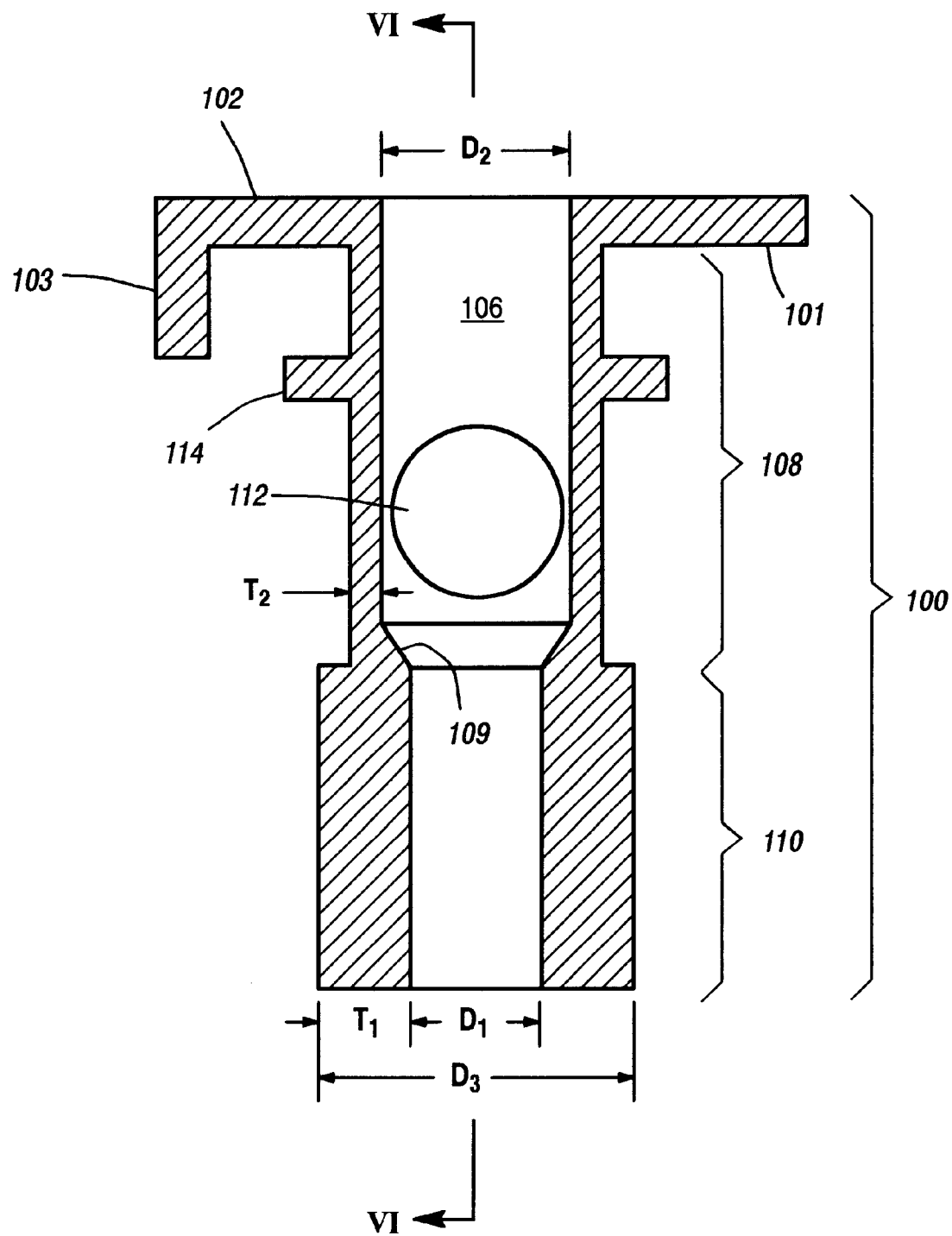
FIG. 5 is a cross-sectional view of the apparatus shown in FIGS. 3 and 4, as indicated in FIG. 4.

Referring to FIG. 5, the opening 106 has a cross-sectional area in the distal section 110 of the body 104 that is smaller than that in the proximal section 108 of the body 104. In other words, the dimension $D_1$ of the opening 106 in the proximal section 110 of the body 104 is smaller than the dimension $D_2$ of the opening 106 in the proximal section 108 of the body 104. A shoulder 109, whether tapered as shown in FIG. 5 or untapered, provides the transition between larger and smaller dimension portions of the opening 106.

By virtue of the diameters or dimensions $D_1$ and $D_2$, and/or by virtue of an enlarged outer dimension $D_3$ of the body 104 in the distal section 110, there is a difference in the wall thickness of the body 104 in the proximal and distal sections 108 and 110, respectively. More specifically, as is illustrated in FIG. 5, a wall thickness $T_1$ of the body 104 in the distal section 110 is greater than the wall thickness $T_2$ of the body 104 in the proximal section 108.

Figure 7:
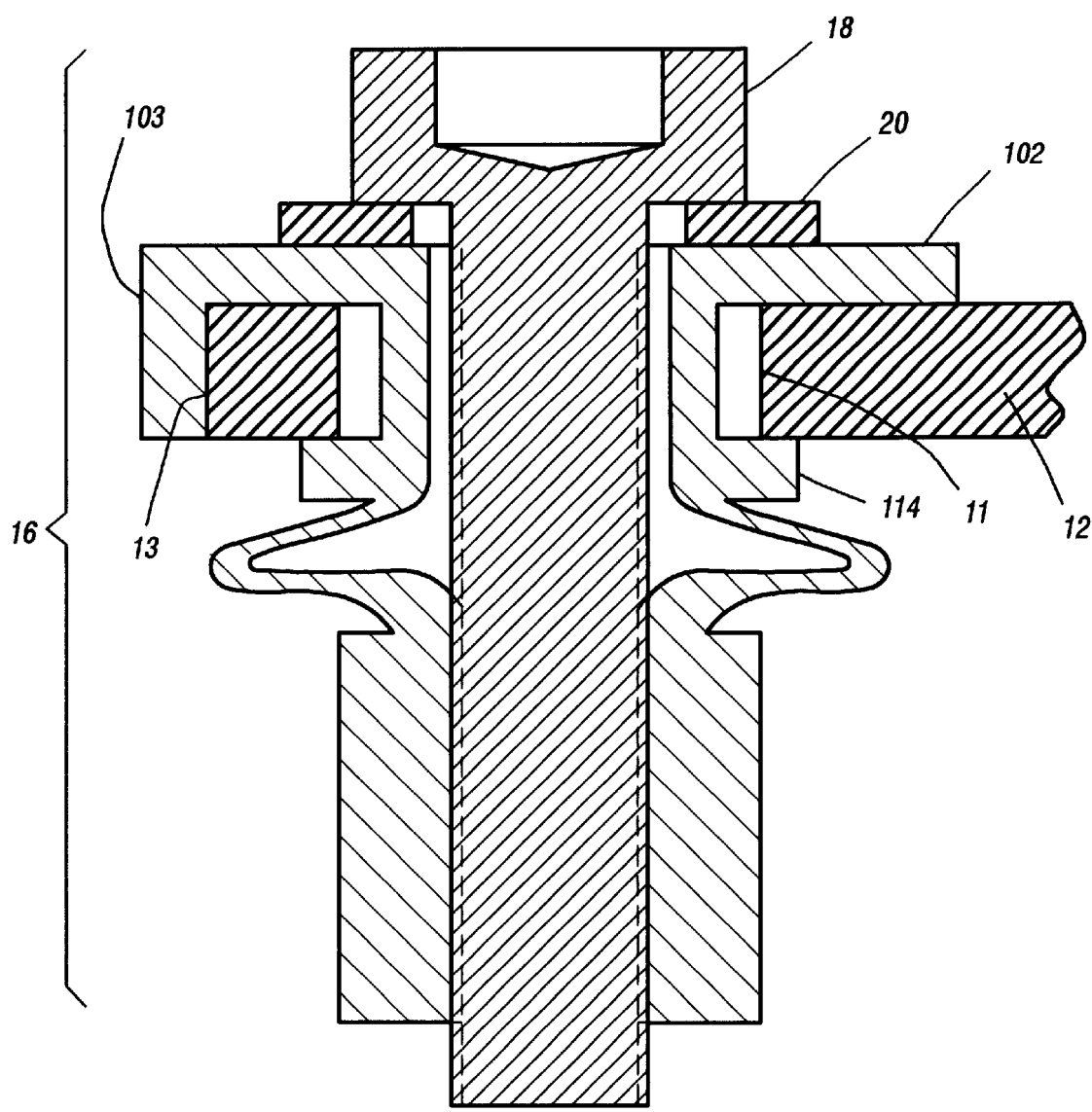
FIG. 7 is a cross-sectional view of an embodiment of a fastener system according to this invention, in an assembled condition.

As will be described later in greater detail with reference to FIG. 7, the dimension $D_2$ of the opening 106 in the proximal section 108 of the body 104 of the apparatus 100 is sized to receive the threaded fastener 18. The threaded fastener 18 preferably passes through the proximal section 108 of the body 104 with little or no interference between the threads of the threaded fastener 18 and the interior surface of the opening 106. In sharp contrast, the dimension $D_1$ of the opening 106 in the distal section 110 of the body 104 is sized to bring about threaded engagement between the threads of the threaded fastener 18 and the inner surface of the opening 106. The relationship between the threaded fastener 18 and the inner surface of the opening 106 is illustrated in FIG. 7.

A perforation, such as the illustrated aperture 112, is preferably formed in the body 104 at a location corresponding to the proximal section 108. The perforation can be provided in the form of a hole (as is illustrated in FIG. 5, for example), a slit, a slot, or any other perforation that is capable of promoting deformation of the body 104 in it's proximal section 108 as the threaded fastener 18 is engaged with the distal section 110 of the body 104. The deformation of proximal section 108 is shown in FIG. 7 and described with reference to FIG. 7 later.

Figure 6:
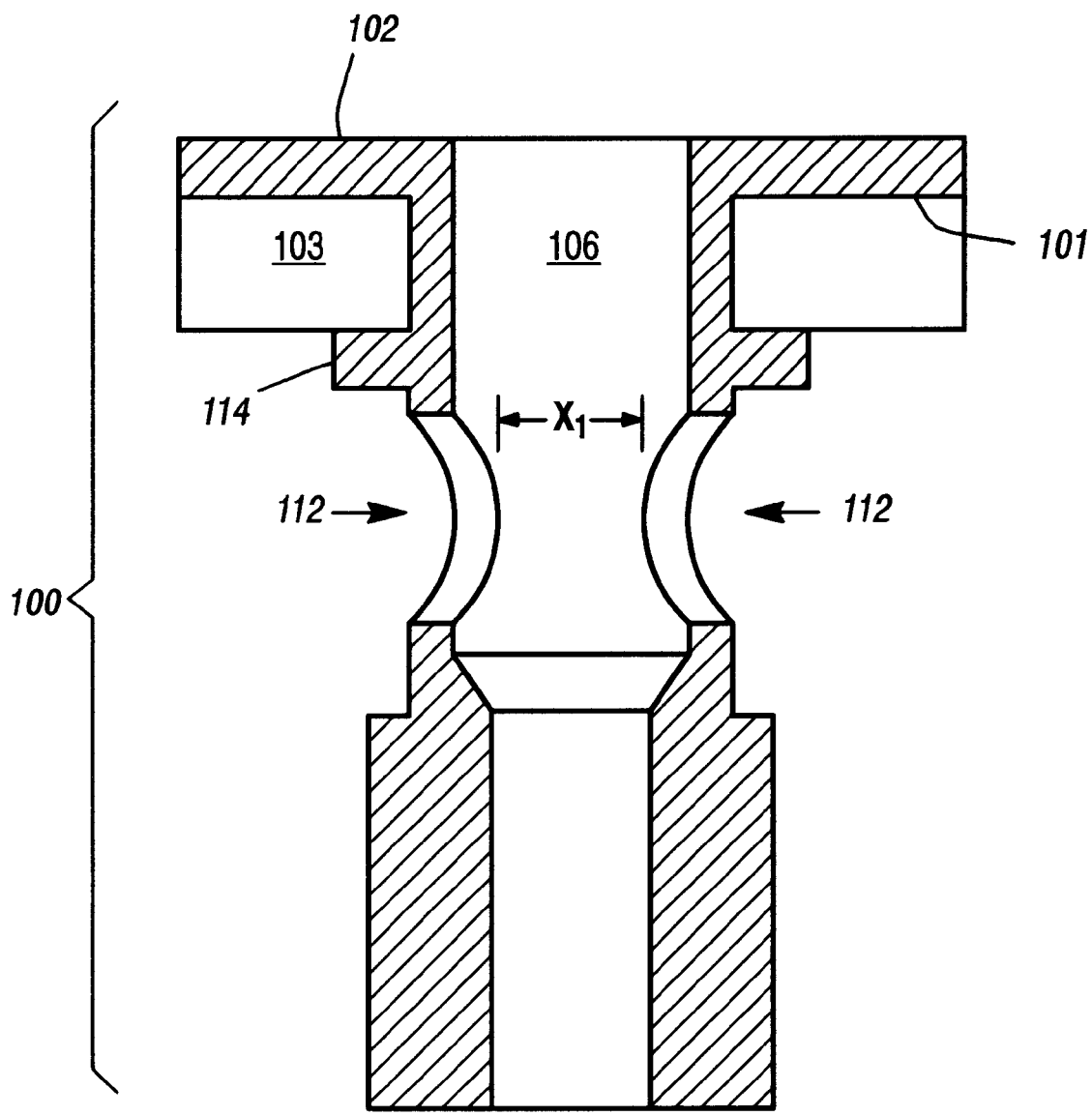
FIG. 6 is another cross-sectional view of the apparatus shown in FIGS. 3–5, as indicated in FIG. 5.

The apparatus 100 is also provided with a circumferential flange 114 that defines an outwardly extending surface, as is illustrated in FIGS. 5 and 6. The flange 114 helps to capture the apparatus 100 within the aperture 11 of the support 12. As is illustrated in FIG. 7, the outer dimension of the body 104 at a location between the flanges 114 and 102 of the body 104 is preferably selected so that the apparatus 100 is capable of radial movement with respect to the support 12 after it is inserted. Such movement assists with the alignment of the threaded fastener 18, the aperture 11 of the support 12, the aperture 15 of the computer component 14, and the washer 20 upon installation.

In addition to helping to capture the apparatus 100 within the aperture 11 of the support 12, the flange 114 also helps to control the manner in which the proximal section 108 of the body 104 deforms upon engagement with the threaded fastener 18. More specifically, referring to FIG. 7, as the threaded fastener 18 is tightened to bring about engagement with the distal section 110 of the apparatus 100, the body 104 of the apparatus 100 is longitudinally compressed in that the distal end of the body 104 is drawn toward the support 12. It is this contraction of the body 104 that brings about deformation in the proximal section 108 of the body 104.

A proximal surface of the flange 114 of the apparatus 100 bears against a distal surface of the support 12. This contact between the flange 114 and the support 12 helps to promote deformation of the proximal section 108 of the body 104 along the length between the distal surface of the flange 114 and the proximal end of the distal section 110. In other words, the flange 114 concentrates the deformation of the proximal section 108 in a pre-selected portion of the body 104. Simultaneously, by virtue of contact between the flange 114 and the support 12, compression and deformation of the portion of the body 104 between the flanges 114 and 102 of the apparatus 100 is reduced. By reducing or eliminating the deformation of the body 104 in the region between the flanges 114 and 102, the clearance between the outer dimension of the body 104 of the apparatus 100 and the inner surface of the aperture 11 of the support 12 is maintained. Accordingly, the flange 114 cooperates with the aperture 112 to concentrate the deformation of the body 104 to the longitudinal portion of the body 104 between the flange 114 and the distal section 110.

Referring now to FIG. 7, a preferred manner of using the apparatus 100 and fastener system 16 according to this invention will now be described. Although it is not shown in FIG. 7, it should be appreciated that the mounting flange portion of a computer component 14 will be installed between the washer 20 and the flange 102 of the apparatus 100 in order to mount the computer component 14 to the support 12. The apparatus 100 is inserted through the aperture 11 provided in the support 12. A manual force should be sufficient to overcome any interference between the outer surface of the flange 114 of the body 104 of the apparatus 100 and the inner surface of the aperture 11 of the support 12.

The flange portion 103 of the flange 102 of the apparatus 100 is position to contact the edge surface 13 of the support 12. As discussed previously, the contact between the flange portion 103 and the edge surface 13 resists rotation of the apparatus 100 with respect to the support 12 as the threaded fastener 18 is threaded into the apparatus 100. It will be understood that threaded engagement between the threaded fastener 18 and the apparatus 100 is promoted because the flange portion 103 is provided to resist rotation of the apparatus 100 along with the threaded fastener 18 as it is turned by the user.

After the apparatus 100 is inserted through the aperture 11 of the support 12, a mounting flange portion of the computer component 14 is positioned adjacent to the flange 102 of the apparatus 100. The respective apertures of the computer component 14, the support 12, and the opening 106 of the apparatus 100 are aligned to accommodate the threaded fastener 18.

After the washer 20 is positioned adjacent to the proximal surface of the mounting flange portion of the computer component 14 (not shown), the threaded fastener 18 can be inserted through the washer 20, through the aperture (not shown) in the computer component 14, and into the opening 106 of the apparatus 100.

While other fasteners are contemplated as well, threaded fastener 18 is preferably a thread rolling or a thread-cutting screw that forms internal threads in the apparatus 100. As engagement between the threaded fastener 18 and the apparatus 100 progresses, the proximal section 108 of the body 104 of the apparatus 100 deforms outwardly (especially at the location between the flange 114 and the distal section 110 of the body 104). One or more perforations such as the aperture 112 weaken a portion of the proximal section 108 so as to promote the deformation. Also, as discussed previously, the flange 114 also helps to concentrate the deformation at that location. Upon full engagement between the threaded fastener 18 and the apparatus 100, the deformation of the body 104 prevents axial movement of the apparatus 100 with respect to the support 12.

Although this invention has been described with reference to particular embodiments selected for illustration in the drawings, it will be appreciated that many variations and modifications to the illustrated embodiments can be made without departing from the spirit and scope of this invention. The apparatus according to the invention can be formed from a wide variety of materials. Although it is preferably formed from a plastic material such as NYLON, the apparatus can also be formed from a metallic material such as aluminum or steel. If formed from a plastic material, the apparatus can be formed by injection molding or machining processes or even by extrusion, depending upon the exact configuration of the apparatus.

The apparatus is preferably provided with a flange portion (such as the flange portion 103 illustrated in FIGS. 3–7) for engaging an edge surface of a support (such as the edge surface 13 of the support 12 illustrated in FIG. 1). Such a flange portion can have a wide variety of configurations to resist rotation of the apparatus with respect to the support. Although the opening 106 through the body 104 has a circular cross-sectional area or profile, it will be appreciated that the opening need not be round or of constant shape along its length.

It is preferred for the size of the opening 106 to be constant throughout the proximal section 108 and also constant throughout the distal section 110. Such a configuration provides a discrete juncture between the proximal section 108 and the distal section 110, thereby promoting controlled deformation at a predetermined position along the length of the body 104. While the former configuration is preferred, other configurations are contemplated as well.

The outer dimension at the distal section 110 of the body 104 is preferably larger than that along the proximal section 108. It is also contemplated, however, that the outer diameter (or outer shape if not round) of the body 104 can be substantially constant along its length with the possible exception of the flange 114, if the optional flange 114 is provided. With or without a larger outer shape in the distal section 110, the smaller area or profile of the opening 106 in the distal section 110 as compared to that in the proximal section 108 provides a stiffer wall to resist deformation as well as a greater wall thickness to accommodate and engage the threads of the threaded fastener 18.

The perforation (such as the aperture 112 shown in FIG. 5) formed in the proximal section 108 of the body 104 is preferably round. By virtue of a round aperture 112, the wall surface in the proximal section 108 essentially tapers by virtue of the aperture or apertures 112 toward the longitudinal position of the body 104 corresponding to the center or centers of the aperture or apertures 112. Such a taper further controls the location at which the body 104 deforms. Such deformation will occur where there is the least amount of wall material (see, for example, the circumferential distance $X_1$ between the apertures 112 at their centers illustrated in FIG. 6).

The provision of a taper to further control the point of deformation can also be accomplished using one or more apertures of different shapes. For example, one or more diamond-shaped apertures can be provided at the proximal section 108 of the body 104 of the apparatus 100, thereby providing a point of minimum wall material at the widest point of the diamond or diamonds. Alternatively, longitudinally or angled slits or slots can be provided at the proximal section 108 of the body 104 to help promote deformation along that portion of the body 104.

Another alternative is to completely eliminate the aperture or apertures in the proximal section 108 of the body 104. The reduced thickness of the wall in the proximal section 108 (designated $T_2$ in FIG. 5) of the body 104 (by virtue of the larger dimension $D_3$ of the body 104 in the distal section 110 and/or the smaller dimension $D_1$ of the body 104 in the distal section 110), even without one or more apertures or the flange 114, will concentrate the deformation of the body 104 in the proximal section 108.

The threaded fastener 18 is most preferably a threaded screw such as a thread-rolling or thread-cutting screw. Especially if the apparatus 100 is formed from a metallic material, and especially if the apparatus 100 and the fastener system 16 is used in conjunction with an electronic or computer system as opposed to other types of rack mount systems, then it is preferable to use a thread-rolling screw for the threaded fastener 18 to avoid the propagation of metallic shavings.

It will be appreciated that additional variations and modifications of the disclosed, preferred embodiments can be made without departing from the scope of this invention, which is defined separately in the appended claims.

What is claimed:

1. An apparatus for retaining a threaded fastener in an aperture of a support, said apparatus comprising:
    a first flange positioned to limit insertion of said apparatus within the aperture of the support;
    a body extending axially from said first flange and being sized for insertion within the aperture of the support, said body defining an opening extending through proximal and distal sections of said body, said opening in said body being sized to receive the threaded fastener in said proximal section of said body and said opening in said body being sized for engagement of the threaded fastener in said distal section of said body, said proximal section of said body being configured for radial deformation upon engagement of the threaded fastener in said distal section of said body, said deformation preventing removal of said body from the aperture of the support; and
    a second flange extending circumferentially outward from said proximal section of said body and spaced from said first flange.

2. The apparatus defined in claim 1, said first flange extending radially outwardly with respect to an axis of said body.

3. The apparatus defined in claim 1, said first flange including a flange portion extending axially and positioned to resist rotation of said apparatus with respect to the support.

4. The apparatus defined in claim 3, said flange portion extending substantially parallel to the axis of said body.

5. The apparatus defined in claim 1, said first flange extending radially outwardly from a proximal end portion of said body.

6. The apparatus defined in claim 1, said body being substantially tubular.

7. The apparatus defined in claim 1, said opening having an area in said distal section of said body that is smaller than that in said proximal section of said body.

8. The apparatus defined in claim 1, said proximal section of said body being provided with at least one perforation positioned to promote said radial deformation of said proximal section upon engagement of the threaded fastener in said distal section of said body.

9. The apparatus defined in claim 8, said perforation in said proximal section of said body defining an aperture.

10. The apparatus defined in claim 1, said body having a wall thickness in said proximal section that is thinner than that in said distal section of said body.

11. The apparatus defined in claim 1, said proximal section of said body being sized to permit radial movement of said apparatus within the aperture of the support.

12. A fastener system for mounting a component to a support, said fastener system comprising:
    a threaded fastener sized for insertion within apertures of the component and the support; and
    an apparatus configured to engage said threaded fastener, said apparatus including a first flange positioned to limit insertion of said apparatus within the aperture of the support, said apparatus also including a body extending axially from said first flange and being sized for insertion within the aperture of the support, said body defining an opening extending through proximal and distal sections of said body, said opening in said body being sized to receive said threaded fastener in said proximal section of said body and said opening in said body being sized for engagement of said threaded fastener in said distal section of said body, said proximal section of said body being configured for radial deformation upon said engagement of said threaded fastener in said distal section of said body, said deformation preventing removal of said body from the aperture of the support, and a second flange extending circumferentially outward from said proximal section of said body and spaced from said first flange.

13. The fastener system defined in claim 12, said opening in said body of said apparatus having a profile in said distal section of said body that is smaller than a profile of said opening in said proximal section of said body.

14. The fastener system defined in claim 13, said profile of said opening in said distal section being smaller than the profile of said threaded fastener, and said profile of said opening in said proximal section being at least as large as said profile of said threaded fastener.

15. The fastener system defined in claim 12, said threaded fastener being a screw.

16. The fastener system defined in claim 15, said screw being selected from the group consisting of a thread rolling screw and a thread forming screw.

17. The fastener system defined in claim 12, further comprising a washer.

18. A rack mount computer cabinet comprising:
    a support defining a plurality of apertures;
    a computer component positioned adjacent said support, said computer component having a plurality of apertures aligned with selected apertures of said support;
    threaded fasteners inserted within said apertures of said computer component and said selected apertures of said support; and
    an apparatus inserted into at least one of said selected apertures of said support and engaging at least one of said threaded fasteners, said apparatus including a first flange positioned adjacent said support to limit insertion of said apparatus into said aperture of said support, said apparatus also including a body extending axially from said first flange and within one of said selected apertures of said support, said body defining an opening extending through proximal and distal sections of said body, said opening in said body receiving said threaded fastener in said proximal section of said body and said opening in said body engaging said threaded fastener in said distal section of said body, said proximal section of said body being radially deformed upon said engagement of said threaded fastener in said distal section of said body, said deformation preventing removal of said body from said aperture of said support, and a second flange extending circumferentially outward from said proximal section of said body and spaced from said first flange.

19. The rack mount computer cabinet defined in claim 18, said proximal section of said body of said apparatus being deformed such that the profile of said proximal section is larger than the profile of said aperture in said support, thereby preventing removal of said apparatus from said aperture of said support.

20. The rack mount computer cabinet defined in claim 18, said support comprising an edge surface and said first flange of said apparatus including a flange portion extending axially and positioned to contact said edge surface of said support, thereby resisting rotation of said apparatus with respect to said support.

21. The apparatus defined in claim 1, said second flange extending radially outwardly with respect to an axis of said body.

22. The apparatus defined in claim 1, said second flange being positioned between said first flange and portions of said proximal section that are configured for said radial deformation.

23. The apparatus defined in claim 7, said distal section of said body having outer surface portions that project radially outwardly from outer surface portions of said proximal section of said body.

24. The fastener system defined in claim 12, said second flange extending radially outwardly with respect to an axis of said body.

25. The fastener system defined in claim 12, said second flange being positioned between said first flange and portions of said proximal section that are configured for said radial deformation.

26. The fastener system defined in claim 13, said distal section of said body having outer surface portions that project radially outwardly from outer surface portions of said proximal section of said body.

27. The rack mount computer cabinet defined in claim 18, said second flange extending radially outwardly with respect to an axis of said body.

28. The rack mount computer cabinet defined in claim 18, said second flange being positioned between said first flange and portions of said proximal section that are configured for said radial deformation.

29. The rack mount computer cabinet defined in claim 18, said support being positioned between said first flange and said second flange.

30. The rack mount computer cabinet defined in claim 18, said opening having an area in said distal section of said body that is smaller than that in said proximal section of said body, and said distal section of said body having outer surface portions that project radially outwardly from outer surface portions of said proximal section of said body.

* * * * *